United States Patent [19]

Stefani

[11] Patent Number: 4,636,713
[45] Date of Patent: Jan. 13, 1987

[54] MONOLITHICALLY INTEGRATABLE CONTROL CIRCUIT FOR SWITCHING INDUCTIVE LOADS COMPRISING A DARLINGTON-TYPE FINAL STAGE

[75] Inventor: Fabrizio Stefani, Cardano al Campo, Italy

[73] Assignee: SGS-ATES Componenti Elettronici S.p.A., Italy

[21] Appl. No.: 683,808

[22] Filed: Dec. 20, 1984

[30] Foreign Application Priority Data

Dec. 20, 1983 [IT] Italy .............................. 24252 A/83

[51] Int. Cl.$^4$ .......................................... H03K 17/60
[52] U.S. Cl. .................................. 323/350; 307/254; 307/315; 307/412; 323/289
[58] Field of Search ............... 307/254, 270, 280, 300, 307/315, 412; 361/13, 56; 323/289, 350

[56] References Cited

U.S. PATENT DOCUMENTS

| 4,227,099 | 10/1980 | Houkes | 307/315 |
| 4,455,526 | 6/1984 | Miller | 323/289 |
| 4,549,095 | 10/1985 | Stefani | 307/254 |

FOREIGN PATENT DOCUMENTS 2117204 10/1983 United Kingdom .

Primary Examiner—Patrick R. Salce
Assistant Examiner—Jeffrey Sterrett
Attorney, Agent, or Firm—Harry M. Weiss & Associates

[57] ABSTRACT

A monolithically integratable control circuit for switching inductive loads, comprising a Darlington-type final stage, is described. The base of the Darlington control transistor is coupled to the collector of a transistor for extracting charge, the transistor conducting in phase opposition to the Darlington control transistor. The emitter of the transistor for extracting charge is coupled to the negative supply terminal and to the output terminal of the final stage, via a first and a second diode respectively.

13 Claims, 1 Drawing Figure

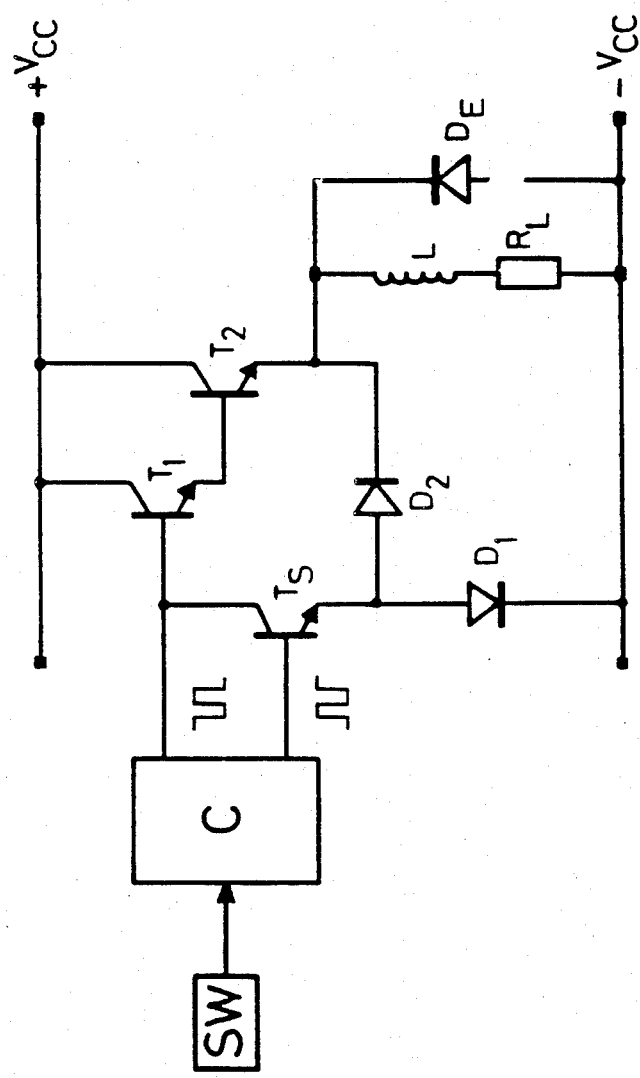

MONOLITHICALLY INTEGRATABLE CONTROL CIRCUIT FOR SWITCHING INDUCTIVE LOADS COMPRISING A DARLINGTON-TYPE FINAL STAGE

BACKGROUND OF THE INVENTION

1. Field of the Invention

The invention relates to monolithically integratable control circuits for switching inductive loads and, more particularly, to control circuits of the kind comprising a Darlington-type final stage for use in actuating relays, solenoids and d.c. motors.

2. Description of the Related Art

Switching control circuits of the kind described herein usually comprise a final power transistor coupled in series with the inductive load between the two terminals of a supply voltage generataor and alternately switched, via a base control signal, from a high-voltage low-current state to a low-voltage high-current state.

In the first state (the "off" state), the transistor is virtually an open circuit between the emitter and collector terminals. In the second or "on" state, a short-circuit is established. Thus, the two states respectively prevent or allow current to flow through the load.

As is known, the manner of operation of a transistor closest to the operation of an ideal switch is that in which the transistor operates in a saturation condition when closed and is in a cut off condition when open.

In the latter case, however, the maximum possible switching frequency of the transistor is mainly limited, during the change-over from a saturation condition to a cut-off condition by the effects of the storage of charge occurring during the conduction phase. The switching frequency limitation arises because the collector region of power transistors, which is dense and has high resistivity in order to withstand high inverse voltages, has a relatively long switching-off transient phase during which an increase in collector-emitter voltage does not correspond to a decrease in the collector current, the collector current remaining constant for a certain time.

This phase, of course, is the phase in which the transistor dissipates most energy even though it is of no use in operation. When the load coupled to the final stage is inductive, the counter-EMF induced by the variation in the current through the load, due to switching of the final stage, abruptly increases the collector-emitter voltage of the still conducting transistor during the switching-off phase. The counter-EMF, in combination with the supply voltage, thus produces very high power dissipation in the transistor, sometimes with destructive effect.

A reduction in the switching-off time, therefore, is advantageous both for increasing the maximum possible switching frequency and for improving the efficiency of the control circuit with regard to energy consumption, because of the reduction in time when the operation of the final power transistor departs from the operation of an ideal switch.

The usual method for reducing the switching time of a power transistor operating in saturation during the conduction stage is to couple the base of the transistor to a circuit means having a low impedance, thus enabling the charge stored in the transistor to flow away rapidly when the saturated transistor is switched off.

The circuit means can simply be a transistor which is actuated in phase opposition relative to the transistor to be switched off. The circuit means produces a current for extracting the charge from the base of the switched-off transistor. The phase-opposition transistor is inserted with its collector and emitter terminals between the load and the base of the power transistor to be switched off, or between the base and the supply voltage generator terminal to which the load is coupled.

In the first case the efficiency with which charge is extracted is not very high because the collector-emitter voltage applied to the extraction transistor is limited. Even so, extraction continues until switching-off is complete.

In the second case, however, the extraction transistor initially acts more efficiently since the collector-emitter voltage applied to it is higher. Extraction, however, is interrupted before the final transistor has been completely switched off, if the load is of the inductive type. The reason for interruption of extraction is that, during switching-off, a counter-EMF is induced in an inductive load that lowers the potential levels of the final transistor, coupled to the load, below the potential level of the negative supply terminal. Consequently, if the extracting transistor has its emitter coupled to the negative supply terminal, the extraction transistor is inversely polarized and stops extracting charges. On the contrary, a diode has to be inserted between the two transistors to prevent any feedback of current.

In order therefore to obtain high switching rates in a circuit for controlling inductive loads, it is necessary to combine the two previously-mentioned systems, using two different extraction transistors, the emitter of one transistor being coupled to the negative supply terminal, whereas the other transistor is coupled to the output terminal, as described e.g. in Italian Patent Application No. 20213/A 82 by the present applicants.

This method of extracting charge from the switched-off saturated transistor is very effective initially and continues until switching-off is complete.

Clearly, however, this method involves a more complicated circuit, owing to the polarization and control means required, and more space is needed for integration of the circuit elements, thus increasing implementation expense. The same considerations also apply to control circuits which the final power transistor is kept in the active zone of its operating range, but is switched by a transistor which operates in saturation when conductive. In that case, to increase the rate of switching, the base of the last-mentioned transistor must be coupled to one or two extraction transistors as previously described, so as to accelerate the discharge process.

This case applies, e.g., to the case of the control switching circuits to which the invention relates, such circuits comprising a Darlington circuit final stage made up of a final power transistor operating in the active zone and its control transistor operating in saturation, the two being interconnected at a common collector. NPN type transistors are normally used, owing to their switching characteristics.

Switching control circuits of the aforementioned kind are used for special applications in which it is important to reduce energy consumption by the circuit when inoperative, since such consumption is the largest item in the total consumption during the various operating stages. A Darlington circuit final stage has low consumption when inoperative, less than that of other final stages, since its current gain is very high.

Even though a Darlington circuit stage requires a minimum voltage for operation, equal to a base-emitter voltage plus a collector-emitter voltage at saturation, thus resulting in a greater loss of useful voltage, this voltage loss is an unimportant percentage of the supply voltages normally used for control circuits for switching inductive loads.

Furthermore, a Darlington circuit final stage, particularly if made up of NPN transistors, has considerable advantages regarding integration and can be switched more quickly than a single final transistor of equal power operating in saturation.

SUMMARY OF THE INVENTION

It is an object of the invention is to construct a monolithically integratable control circuit for switching inductive loads comprising a Darlington circuit final stage, the circuit switching at higher speeds and being industrially cheaper than known circuits.

The aforementioned and other objects are accomplished, according to the present invention by coupling a Darlington circuit to an inductive load impedance. An input terminal of the Darlington circuit is coupled to a switching signal and an collector of a control transistor. The base of the control transistor is coupled to the switching signal after the switching signal has been logically inverted. The emitter of the control transistor is coupled through a first diode to ground potential and through a second diode to the load impedance. A third diode is coupled across the load impedanmce to compensate for reverse potentials resulting from the inductive impedance.

These and other features of the invention will be understood upon reading of the following description along with the drawings.

BRIEF DESCRIPTION OF THE DRAWINGS

The single FIGURE is a circuit diagram of a monolithically integrated switching circuit with a Darlington circuit final stage.

OPERATION OF THE PREFERRED EMBODIMENT

Detailed Description of the FIGURE

Referring to the FIGURE, a diagram of a control circuit according to the invention comprising a final Darlington-type stage circuit including a first bipolar transistor $T_1$ and a second bipolar transistor $T_2$, both of NPN type, $T_2$ being the final power transistor and $T_1$ being its cotrol transistor is shown.

The emitter of the final transistor $T_2$, whose collector is coupled to the positive terminal $+V_{cc}$ of a supply voltage generator, constitutes the output terminal for the circuit, which is coupled to the inductive load to be switched off and on. The inductive load, represented by a resistance $R_L$ and an inductance L connected in series, is inserted between the output terminal and the negative terminal of the supply voltage generator, which can be the ground potential of the circuit.

A feedback diode $D_E$ is coupled outside the circuit in parallel to $R_L$ and L. As is known, the feedback diode is necessary because of the inductive load which, after the final transistor has been switched off, must be supplied with the current required for the switching transient condition.

The base of transistor $T_2$ is coupled to the emitter of transistor $T_1$, whose collector is also coupled to the supply voltage generator positive terminal $+V_{cc}$.

The base of transistor $T_1$ is coupled, via a control circuit means represented by a block C in the drawing, to a source of switching signals represented by a block SW, transistor $T_1$ and consequently transistor $T_2$ being switched in response to the switching signals.

The base of transistor $T_1$ is coupled to the collector of a third NPN type bipolar transistor $T_s$, whose base is also coupled to the control circuit means C, so that transistor $T_s$ is switched to the conductive state in phase opposition to transistor $T_1$.

In the drawing, a waveform is shown at the base of transistor $T_1$ and $T_s$ represent the switching signals applied to the bases of the aforementioned transistors.

The emitter of transistor $T_s$ is coupled to the anodes of a first and a second diode $D_1$ and $D_2$. The cathodes diodes $D_1$ and $D_2$ are respectively coupled to the negative terminal $-V_{cc}$ of the supply voltage generator and to the emitter of the final power transistor $T_2$.

Operation of the Preferred Embodiment

During the state when the transistors $T_1$ and $T_2$ of the final Darlington circuit stage are conductive, transistor $T_s$ is kept switched off by the control circuit means C.

When, in response to a switching signal from source SW, the control circuit means C switches off transistor $T_1$ and consequently transistor $T_2$, it simultaneously switches on transistor $T_s$, which immediately produces a current for extracting charges from the base of transistor $T_1$, which is still saturated, thus accelerating its switching-off transient.

As has been stated, it is easier to switch off a Darlington circuit final stage than a single final transistor of equal power, because the control transistor operating in saturation has very reduced dimensions in a Darlington circuit stage, thus limiting the accumulation of charges therein.

Consequently transistor $T_s$ can be made smaller than the transistors used for discharging a single final power transistor operating in saturation. During the switching-off process, the current flowing from the base of transistor $T_1$ via transistor $T_s$ is initially discharged to ground potential via diode $D_1$. Owing however to the counter-EMF induced in the inductive load L during the switching process, the voltage level of the emitter of transistor $T_2$ drops below the potential level of the negative terminal of the supply voltage generator, thus bringing the emitter and base potentials of $T_1$ below the supply voltage level also.

As a result, diode $D_1$ is inversely polarized and no longer conductive. However, diode $D_2$ is directly polarized so that the emitter current of transistor $T_s$ can flow through it to the negative terminal $-V_{cc}$ (via load L and $R_L$) until transistor $T_1$ has been completely switched off.

The extraction current flowing through the load is not a disadvantage because the extraction current may only be a fraction of the current needed by the inductive load during its normal switching-off transient condition. The dimensions of the feedback diode $D_E$ can be advantageously reduced.

It is therefore clear that a control circuit for switching, according to the invention, comprising a Darlington circuit final stage, can give a high switching rate and also greatly simplify the circuit and effectively reduce the total substrate integration area compared with known circuits. The control circuit can also be made up exclusively of NPN-type transistors, which is advantageous both technologically and with regard to the switching rates.

A second, but no less important advantage of the circuit in the FIGURE, is it that transistor $T_s$ can also be supplied by a smaller voltage source than the voltage source for the final stage, with a resulting saving in supply energy.

Although only one embodiment of the invention has been illustrated and described, numerous variations will be clear to those skilled in the art. For example, the described control circuits can form part of a more complex control circuit, e.g. a control circuit for inductive loads, operating with a push-pull final stage. Also, the Darlington circuit final stage can be switched "in time", by the method and by the circuit means described in the patent application cited above, by the present inventors, according to which the charge-extracting circuit means are actuated only for a certain time after the switching-off of the final stage begins, to prevent delays in subsequent switching-on.

The above description is included to illustrate the operation of the preferred embodiment and is not means to limit the scope of the invention. The scope of the invention is to be limited only by the following claims. From the above discussion, many variations will be apparent to one skilled in the art that would yet be encompassed by the spirit and scope of the invention.

What is claimed is:

1. A monolithically integratable circuit for controlling the switching of inductive loads, the circuit comprising a Darlington final stage comprising a first ($T_1$) and a second ($T_2$) transistor, each of said transistors having a first terminal, a second terminal and a control terminal and each of said transistors having the same type of conductivity, said first and said second terminal of said first transistor ($T_1$) being respectively coupled to said control terminal of said second transistor ($T_2$) and to a first terminal ($+V_{cc}$) of a supply voltage generator, an inductive load (L, $R_L$) being inserted between a second terminal ($-V_{cc}$) of said supply voltage and said first terminal of said second transistor ($T_2$), said second terminal of second transistor ($T_2$) being coupled to said first terminal ($+V_{cc}$) of said supply voltage generator, said control terminal of said first transistor ($T_1$) being coupled to control circuit means (C) coupled to a source of switching signals (SW) in dependence on which said circuit means (C) switches first switches first transistor ($T_1$) and second transistor ($T_2$), the circuit being characterized in that it comprises:
a third transistor $T_s$ having a first terminal, a second terminal and a control terminal and having said same type of conductivity as said first transistor ($T_1$) and said second transistor ($T_2$), said control terminal of said third transistor $T_s$ being coupled to said control circuit means (C) which makes said third transistor conductive in phase opposition relative to said first transistor ($T_1$), said first terminal of said third transistor $T_s$ being coupled to said second terminal ($-V_{cc}$) of said supply voltage generator and to said first terminal of said second transistor ($T_2$) via a first ($D_1$) and a second ($D_2$) diode respectively, said second terminal of said third transistor $T_s$ being coupled to said control terminal of said first transistor ($T_1$).

2. The control circuit according to claim 1, further characterized in that said first transistor ($T_1$), said second transistor ($T_2$) and said third transistor $T_s$ are bipolar transistors; said first terminal, said control terminal and said second terminal of each transistor being an emitter terminal, said base terminal, and a collector terminal respectively.

3. A switching circuit for switching current through an inductive load impedance in response to a first switching signal and a second switching signal comprising:
a Darlington circuit output stage coupled to said inductive load, said first switching signal coupled to an input terminal of said Darlington output stage;
a control transistor having a first terminal coupled to said Darlington output stage input terminal, a control terminal of said control transistor coupled to said second signal; and
a first diode coupled between said inductive load impedance and a second terminal of said control transistor.

4. The switching circuit of claim 3 wherein further including a second diode coupled in parallel with said inductive load impedance and a third diode coupled between said second terminal of said control transistor and a ground potential.

5. The switching circuit of claim 4 wherein said control transistor and transistors comprising said Darlington output stage are NPN bipolar elements.

6. The method of switching current through an inductive load impedance comprising the steps of:
controlling current through said inductive load impedance with a Darlington circuit output stage
applying complementary switching signals to a base terminal of a control transistor and to an input terminal of said Darlington circuit;
coupling a collector of said control transistor to said Darlington circuit input terminals; and
coupling an emitter of said control transistor through a first diode to ground potential and through a second diode to said load impedance.

7. The method of switching current through an inductive load impedance of claim 6 further comprising the step of coupling a diode across said load impedance.

8. A switching circuit for controllably energizing an inductive load by a power supply comprising:
a first transistor having a collector coupled to a first terminal of said power supply;
a second transistor having a collector coupled to said first power supply terminal and a base coupled to an emitter of said first transistor, an emitter of said second transistor coupled to a first terminal of said inductive load a second terminal of said inductive load coupled to a second power supply terminal;
a first diode having an anode coupled to said second power supply terminal and a cathode coupled to said second transistor emitter;
a third transistor having a collector coupled to a base of said first transistor;
a second diode having an anode coupled to an emitter of said third transistor and a cathode coupled to said second transistor emitter; and
a third diode having an anode coupled to said third transistor emitter and having a cathode terminal coupled to said second power supply terminal.

9. The switching circuit of claim 8 wherein said first transistor base and a base of said third transistor are activated by complementary signals.

10. The switching circuit of claim 8 in which said first transistor, said second transistor and said third transistor are NPN bipolar elements.

11. A switching circuit for controlling flow of current through an inductive load to a common potential comprising:
- a Darlington circuit coupled to said conductive load, said Darlington circuit being implemented with NPN bipolar elements;
- control means for conducting current in phase opposition to said Darlington circuit, said control means extracting charge from said Darlington circuit when said Darlington circuit is being switched off, said control means being implemented with NPN bipolar elements; and
- means for transferring said extracted charge to said common potential and said inductive load.

12. The switching circuit of claim 11 further comprising a first signal controlling said Darlington circuit and a second signal controlling said control means, said first signal and said second signal being of opposite phase relationship.

13. A method of controlling current through an inductive load comprising the steps of:
- controlling current through said inductive load by a Darlington circuit in response to a first control signal;
- extracting charge from said Darlington circuit by a transistor, said transistor conducting in phase opposition to said Darlington circuit in response to a second control signal;
- applying said extracted charge to said inductive load; and thereafter
- applying current to said load impedance when an inducted emf causes a voltage of said load impedance to be lower than the common potential.

* * * * *